(12) United States Patent
Poplevine et al.

(10) Patent No.: US 6,229,739 B1
(45) Date of Patent: May 8, 2001

(54) SENSE AMPLIFIER HAVING A BIAS CIRCUIT WITH A REDUCED SIZE

(75) Inventors: Pavel Poplevine, Foster City; Alexander Kalnitsky, San Francisco; Albert Bergemont, Palo Alto, all of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/662,504

(22) Filed: Sep. 14, 2000

Related U.S. Application Data

(62) Division of application No. 09/320,413, filed on May 26, 1999, now Pat. No. 6,122,204.

(51) Int. Cl.[7] ..................................................... G11C 7/00
(52) U.S. Cl. ..................... 365/189.09; 365/205; 365/208; 365/210; 365/227
(58) Field of Search .......................... 365/189.01, 189.09, 365/205, 226, 227, 208, 210

(56) References Cited

U.S. PATENT DOCUMENTS

| | | | | |
|---|---|---|---|---|
| 4,200,918 | | 4/1980 | Glock et al. | 365/210 |
| 4,308,595 | | 12/1981 | Houghton | 365/203 |
| 5,764,097 | * | 6/1998 | Whitfield | 327/540 |
| 5,822,253 | | 10/1998 | Lines | 365/189.11 |
| 5,822,267 | * | 10/1998 | Watanabe et al. | 365/227 |
| 5,990,521 | * | 11/1999 | Horiuchi | 257/369 |
| 6,005,801 | * | 12/1999 | Wu et al. | 365/175 |
| 6,122,204 | * | 9/2000 | Poplevine et al. | 365/189.09 |

\* cited by examiner

*Primary Examiner*—Viet Q. Nguyen
(74) *Attorney, Agent, or Firm*—Pillsbury Winthrop LLP

(57) ABSTRACT

A sense amplifier places a low positive voltage, such as 0.1 to 0.3 volts, on a bit line instead of ground when a memory cell is read by utilizing a current source circuit to output a reference current that biases a Schottky diode. The current source circuit is implemented with a Schottky diode that utilizes the reverse-biased leakage current of the diode to form the reference current. The current source circuit can also be implemented with a current mirror circuit.

3 Claims, 8 Drawing Sheets

SENSE AMPLIFIER HAVING A BIAS CIRCUIT WITH A REDUCED SIZE

This is a divisional of application Ser. No. 09/320,413, filed May 26, 1999, now U.S. Pat. No. 6,122,204.

BACKGROUND OF THE INVENTION

1. Field of the Invention

The present invention relates to sense amplifiers and, more particularly, to a sense amplifier that has a bias circuit with a reduced size.

2. Description of the Related Art

A dynamic random access memory (DRAM) cell is a memory device that retains data stored in the cell for only a short period of time even when power is continuously applied to the cell. As a result, a DRAM cell must be periodically refreshed to maintain the data stored in the cell.

FIG. 1 shows a cross-sectional diagram that illustrates a conventional DRAM cell 100. As shown in FIG. 1, DRAM cell 100 includes an access transistor 102 which is formed in a p-type material 110, and a capacitor 104 which is connected to transistor 102.

Access transistor 102, in turn, includes spaced-apart source and drain regions 112 and 114 which are formed in material 110, and a channel region 116 which is defined between regions 112 and 114. In addition, transistor 102 also includes an access gate 120 which is insulatively formed over channel region 116.

As further shown in FIG. 1, capacitor 104 includes a lower plate 124 which is connected to drain region 114, a dielectric layer 126 which is formed over lower plate 124, and an upper plate 128 which is formed over dielectric layer 126.

In operation, a logic "one" is written to DRAM cell 100 by first placing a programming voltage, such as five volts, on source region 112 while a storage voltage, such as five volts, is applied to the top plate 128 of capacitor 104 and ground is applied to material 110. The storage voltage (which is continuously applied to top plate 128) attracts electrons to the lower plate 124 of capacitor 104 where the electrons begin to accumulate.

After placing a programming voltage on source region 112, access gate 120 is pulsed with an access voltage. This pulse turns on access transistor 102 which causes the electrons on the lower plate 124 of capacitor 104 to flow to source region 112.

The electrons flow from the lower plate 124 of capacitor 104 to source region 112 because the lower plate 124 of capacitor 104 has a potential which is less than five volts (some of the applied voltage is dropped across dielectric layer 126), while source region 112 is at five volts.

When the trailing edge of the pulse again turns off access transistor 102, a positive potential is stored on the lower plate 124 of capacitor 104 due to the decreased number of electrons which are present on the lower plate 124 of capacitor 104.

This positive potential, however, lasts only a short time because electrons from leakage currents are readily attracted to the positive potential. As a result, the positive charge stored on the lower plate 124 of capacitor 104 must be "refreshed" by periodically removing the electrons from the lower plate 124 of capacitor 104.

DRAM cell 100 is erased (a logic "zero" is written to a DRAM cell which already has a logic "one" stored in the cell) by placing ground on source region 112. Once ground has been applied to source region 112, access gate 120 is again pulsed with the access voltage.

This pulse turns on access transistor 102 which causes the electrons in source region 112 to flow to the lower plate 124 of capacitor 104. The electrons flow from source region 112 to the lower plate 124 of capacitor 104 because the lower plate 124 of capacitor 104 has a greater potential than source region 112.

When the trailing edge of the pulse again turns off access transistor 102, the positive potential stored on the lower plate 124 of capacitor 104 is removed due to the increased number of electrons which are again present on the lower plate 124 of capacitor 104.

Due to the overhead required to refresh DRAM cells, large numbers of DRAM cells like cell 100 are typically grouped together to form a memory array. FIG. 2 shows a schematic diagram that illustrates a conventional DRAM array 200.

As shown in FIG. 2, DRAM array 200 includes a plurality of DRAM cells 100 which are formed in rows and columns in two segments S1 and S2. As further shown in FIG. 2, array 200 also includes a plurality of first bit lines BL1–BLm and a plurality of second bit lines BLC1–BLCm.

The first bit lines BL1–BLm are formed adjacent to the columns of cells in first segment S1 so that each bit line BL is connected to all of the source regions 112 in a column of cells. Similarly, the second bit lines BLC1–BLCm are formed adjacent to the columns of cells in second segment S2 so that each bit line BLC is connected to all of the source regions 112 in a column of cells.

Array 200 further includes a plurality of first word lines WL1–WLn and a plurality of second word lines WLC1–WLCn. The first word lines WL1–WLn are formed adjacent to the rows of cells in first segment S1 so that each word line WL is connected to all of the access gates 120 in a row of cells. Similarly, the second word lines WL1–WLn are formed adjacent to the rows of cells in second segment S2 so that each word line WLC is connected to all of the access gates 120 in a row of cells.

As additionally shown in FIG. 2, array 200 includes a sense circuit 210 which has a plurality of sense amplifiers SA1–SAm that are connected to the bit lines BL1–BLm and BLC1–BLCm so that each sense amplifier SA is connected to a bit line from each segment S1 and S2.

Each sense amplifier SA includes a first invertor which is formed from transistors M1 and M3, and a second invertor which is formed from transistors M2 and M4. In addition, each sense amplifier SA also includes a power switch transistor M5 and a ground switch transistor M6.

Each power switch transistor M5 provides power to a sense amplifier SA when a first turn on voltage is applied to a power switch line PSL, while each ground switch transistor M6 connects ground to a sense amplifier SA when a second turn on voltage is applied to a ground switch line GSL.

In operation, a cell is programmed by placing a programming voltage, such as five volts, on the bit line that corresponds with the cell to be programmed, while ground is applied to the remaining bit lines. (A storage voltage, such as five volts, is continuously applied to the top plate 128 of each capacitor 104 and ground is applied to material 110.)

After placing a programming voltage on the bit line, the word line that corresponds with the cell to be programmed is pulsed with an access voltage while ground is applied to the remainder of the word lines. This pulse turns on the access transistor 102 which causes the electrons on the lower plate 124 of capacitor 104 to flow to source region 112.

For example, if cell A in FIG. 2 is to be programmed, the programming voltage is applied to bit line BL1 while ground is applied to bit lines BL2–BLm and BLC1–BLCm. In addition, word line WL1 is pulsed with the access voltage while word lines WL2–WLn and WLC1–WLCn are connected to ground.

To read a row of cells, ground is placed on the bit lines in the segment that contain the row of cells to be read, while a logic high voltage is placed on the bit lines in the remaining segment. (Since the sense amplifiers SA are based on cross-coupled inverters, the logic states on the bit lines in one segment are always the opposite of the logic states on the bit lines in the other segment.) Once the voltages have been placed on the bit lines, the bit lines are isolated so that the bit lines are only connected to the sense amplifiers SA.

After this, a read voltage, such as five volts, is applied to the word line that corresponds to the row of cells to be read, while ground is applied to the remainder of the word lines. If a cell in the row is storing a logic zero, nothing happens.

On the other hand, if a cell in the row is storing a logic one, the positive potential on the capacitor in the cell raises the voltage on the bit line which, in turn, causes the inverters in the sense amplifier to flip. The logic state stored by the cell is then determined by reading the state of the inverters. Since the read step is similar to the step of erasing a programmed cell, each programmed cell must be refreshed after it is read.

For example, if the first row of cells in segment 2 is to be read, ground is placed on bit lines BLC1–BLCm, while a logic high voltage is placed on bit lines BL1–BLm. Once the bit lines have been isolated, the read voltage is applied to word line WLC1 while ground is applied to word lines WLC2–WLCn and WL1–WLn.

One problem with array 200 is that when ground is applied to a bit line during a read operation of the array, each programmed cell 100 in the same column of cells 100 that has access gate 120 connected to ground also has a small sub-threshold leakage current that flows from drain region 114 to source region 112 which, in turn, undesirably erases the cell.

One technique for reducing this sub-threshold leakage current is to place a small positive voltage, e.g., 0.1–0.3 volts, rather than ground on the bit lines that are to be read. One technique for providing this small positive voltage is to use sense amplifiers that are biased by the small positive voltage.

FIG. 3 shows a schematic diagram that illustrates a conventional sense circuit 300. As shown in FIG. 3, sense circuit 300 is similar to sense circuit 210 of FIG. 2 and, as a result, utilizes the same reference numerals to designate the structures which are common to both amplifiers.

As shown in FIG. 3, sense circuit 300 differs from sense circuit 210 in that sense circuit 300 includes a bias circuit 310. Bias circuit 310, in turn, includes a first current source GEN1, a transistor M7 which has a drain and gate connected to current source GEN1, and a resistor R1 which is connected to the source of transistor M7 and ground.

In addition, bias circuit 310 also includes a second current source GEN2, a transistor M8 which has a source, a drain connected to current source GEN2, and a gate connected to the gate of transistor M7; and a transistor M9 which has a source connected to ground, a drain connected to the source of transistor M8, and a gate connected to current source GEN2.

In operation, the output of generator GEN1 is set so that a small positive reference voltage is dropped across resistor R1 in response to a reference current IREF flowing through transistor M7 and resistor R1.

The reference voltage and the reference current IREF are mirrored so that a bias voltage VLB equal to the reference voltage is present at a summing node NS (the source of transistor M8 and the drain of transistor M9), and so that a bias current ILB equal to the reference current IREF flows through transistor M8.

Summing node NS sums the bias current ILB and a sense amp current IS. When each transistor M5 and M6 is turned off, the sense amp current IS, which represents the total current flowing out of the sense amplifiers SA, is substantially zero. In this case, transistor M9 sinks substantially only the bias current ILB.

On the other hand, when each transistor M5 and M6 is turned on, the sense amp current IS is large. In this case, the voltage on node B rises in response to the increased current flow from the sense amplifiers SA which, in turn, turns transistor M9 on harder to sink a larger current that includes both the bias current ILB and the large sense amp current IS.

Thus, by forming a bias voltage VLB at the summing node NS, the voltage on a bit line during a read operation is equal to the bias voltage VLB plus the voltage drops across transistors M6 and transistors M3 or M4, depending on which segment is read.

One problem with bias circuit 310, however, is that bias circuit 310 consumes a significant amount of area. Thus, there is a need for a sense amplifier which has a bias circuit that consumes less silicon real estate.

SUMMARY OF THE INVENTION

A sense amplifier in accordance with the present invention places a low positive voltage, such as 0.1 to 0.3 volts, on a bit line instead of ground when a memory cell is read by utilizing a current source circuit to output a reference current that biases a Schottky diode. The Schottky diode, in turn, can be formed to consume significantly less silicon real estate than the bias circuits conventionally used.

The sense amplifier of the present invention includes a detection circuit which is connected to a bit line and a memory line, a first switch which is connected to the detection circuit, and a second switch which is connected to the detection circuit.

In accordance with the present invention, the sense amplifier also includes a bias circuit which is connected to the second switch. The bias circuit has a current source circuit which is connected to the second switch, and a first Schottky diode which has an input connected to the second switch. The current source circuit sources a reference current which is sunk by the first Schottky diode.

A better understanding of the features and advantages of the present invention will be obtained by reference to the following detailed description and accompanying drawings which set forth an illustrative embodiment in which the principals of the invention are utilized.

DETAILED DESCRIPTION

Figure 1:
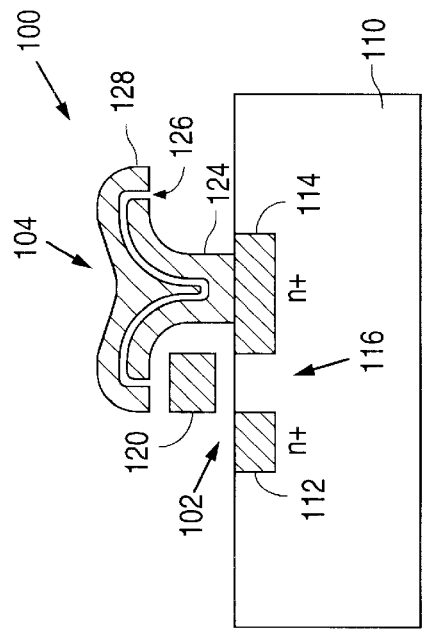
FIG. 1 is a cross-sectional diagram illustrating a conventional DRAM cell 100.
Figure 3:
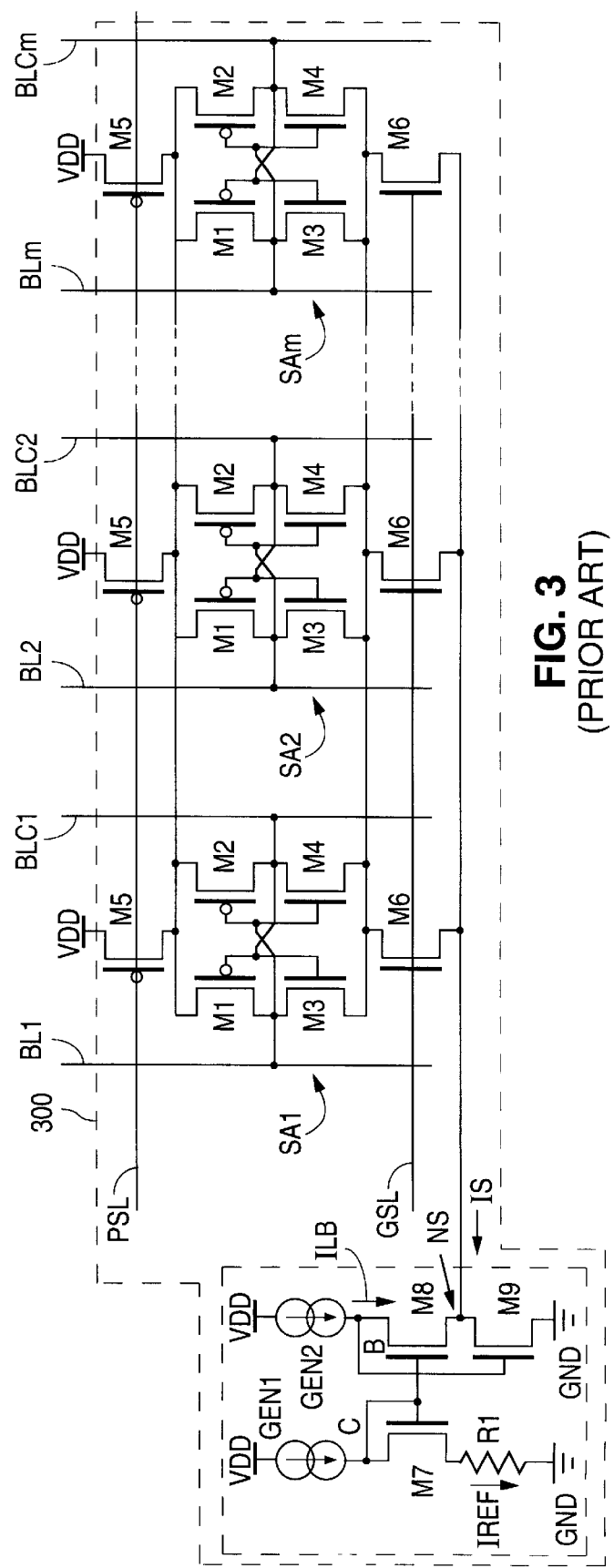
FIG. 3 is a schematic diagram illustrating a conventional sense circuit 300.
Figure 2:
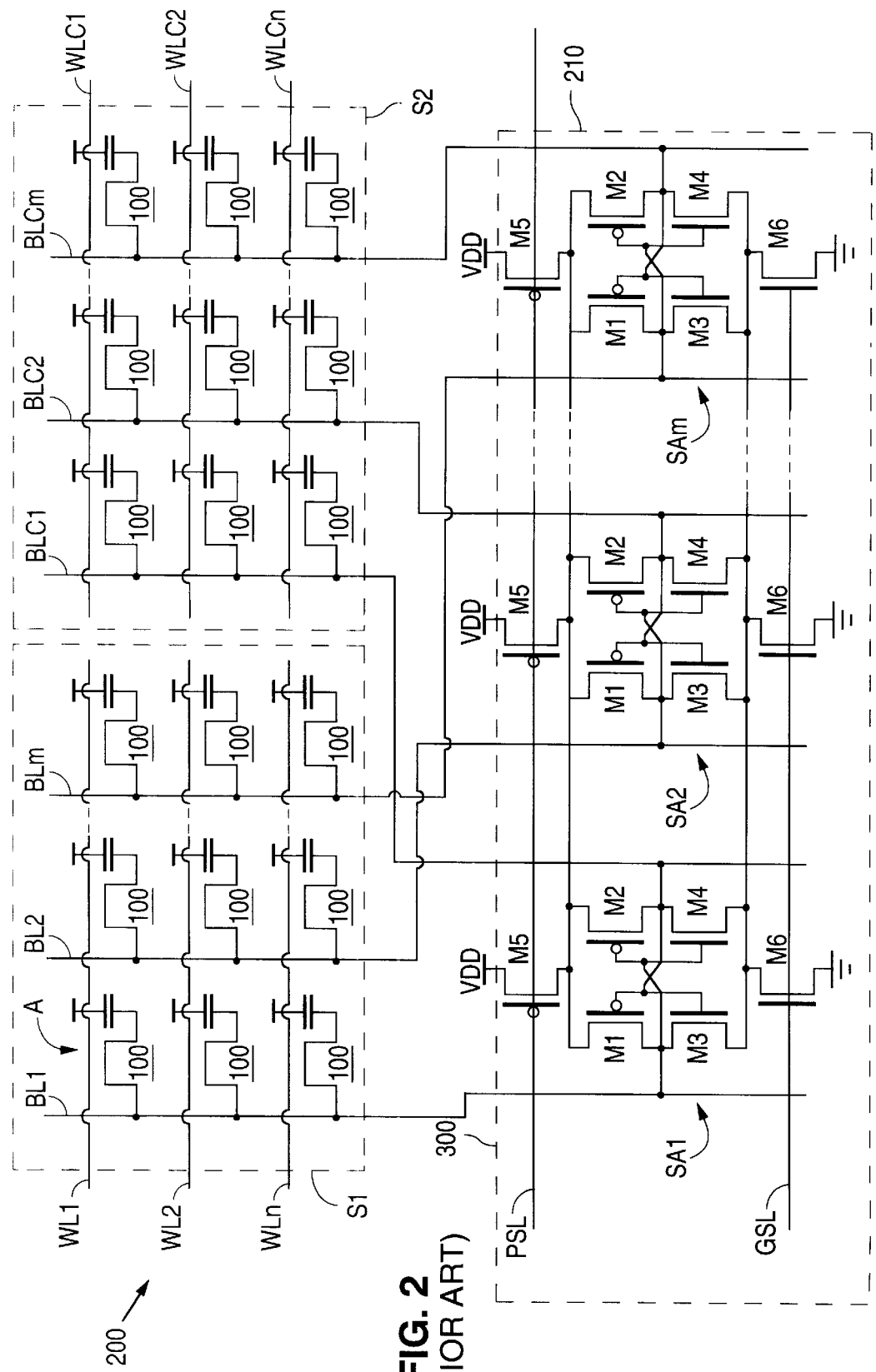
FIG. 2 is a schematic diagram illustrating a conventional DRAM array 200.
Figure 4:
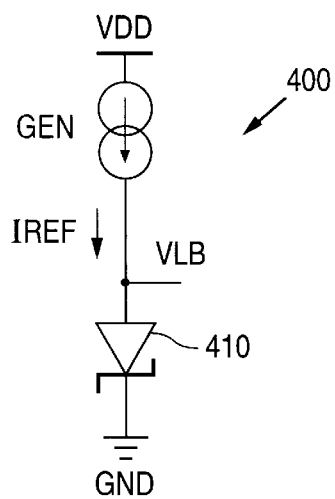
FIG. 4 is a schematic diagram illustrating a bias circuit 400 in accordance with the present invention.

FIG. 4 shows a schematic diagram that illustrates a bias circuit 400 in accordance with the present invention. As shown in FIG. 4, bias circuit 400 includes a current generator GEN that sources a small reference current IREF, and a Schottky diode 410 which has an input connected to generator GEN and an output connected to ground. In operation, diode 410 is biased by the reference current IREF to produce a small positive bias voltage VLB, e.g., 0.1 to 0.3 volts, at the input to diode 410.

Figure 5:
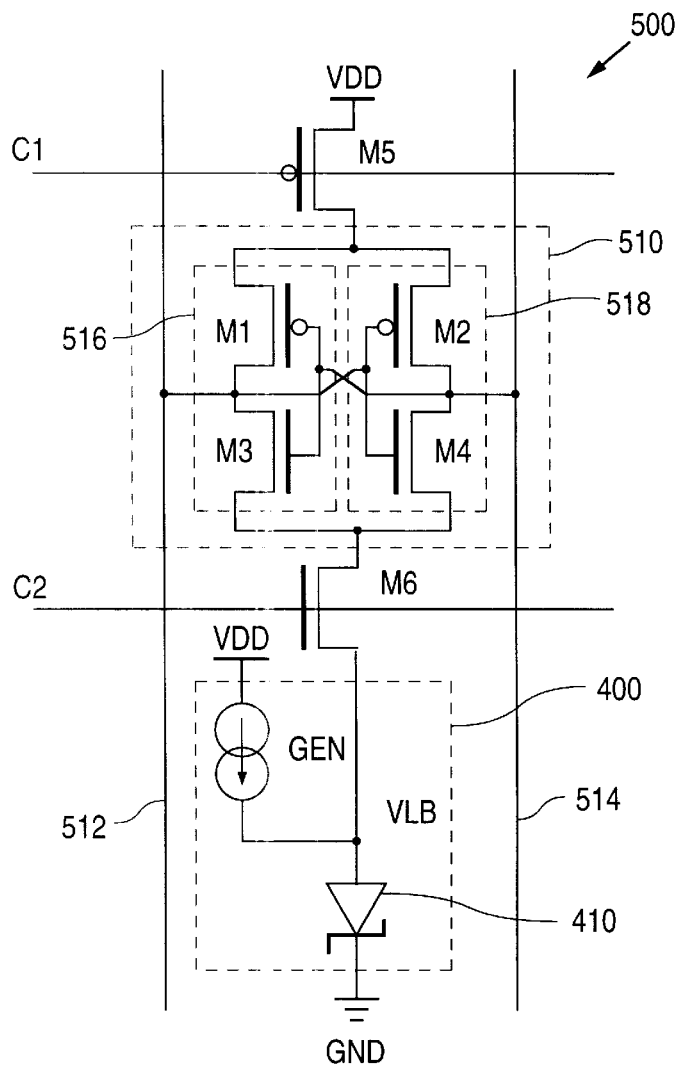
FIG. 5 is a schematic diagram illustrating a sense amplifier 500 in accordance with the present invention.

FIG. 5 shows a schematic diagram that illustrates a sense amplifier 500 in accordance with the present invention. As shown in FIG. 5, amplifier 500 includes a detection circuit 510 which is connected to a bit line 512 and a memory line 514, such as a bit line or a reference line. (Sense amplifier 500 can be connected to two bit lines, or to a bit line and a reference line where the reference line is used to set the logic state of the bit line.)

Detection circuit 510 includes a first inverter 516 which has an output connected to bit line 512 and an input connected to memory line 514. Inverter 516 is implemented with a p-channel transistor M1 and a n-channel transistor M3. Transistor M1 has a source, a drain connected to bit line 512, and a gate connected to memory line 514. Transistor M3 has a source, a drain connected to the drain of transistor M1, and a gate connected to memory line 514.

Detection circuit 510 also includes a second inverter 518 which has an output connected to memory line 514 and an input connected to bit line 512. Inverter 518 is implemented with a p-channel transistor M2 and a n-channel transistor M4.

Transistor M2 has a source connected to the source of transistor M1, a drain connected to memory line 514, and a gate connected to bit line 512. Transistor M4 has a source connected to the source of transistor M3, a drain connected to the drain of transistor M3, and a gate connected to bit line 512.

As further shown in FIG. 5, sense amplifier 500 also includes a first switch which is implemented with a p-channel transistor M5, and a second switch which is implemented with a n-channel transistor M6. Transistor M5 has a source connected to a power node, a drain connected to the sources of transistors M1 and M2, and a gate connected to a first control line C1. Transistor M6 has a source, a drain connected to the sources of transistors M3 and M4, and a gate connected to a second control line C2.

In accordance with the present invention, sense amplifier 500 further includes bias circuit 400 which has the input of Schottky diode 410 connected to the source of switch M6.

In operation, once a first logic state has been placed on bit line 512 and a second logic state has been placed on memory line 514, control line C1 is lowered to turn on transistor M5 while control line C2 is raised to turn on transistor M6.

The line 512 or 514 which has the logic high state turns on the n-channel transistor M3 or M4 which has a drain connected to the opposite line 512 or 514. As a result, the voltage on the opposite line 512 or 514 is equal to the bias voltage VLB plus the voltage drops associated with transistors M3 or M4, and M6.

For example, if a logic low is placed on bit line 512 and a logic high is placed on memory line 514, transistor M1 is turned off and transistor M3 is turned on. In addition, transistor M2 is turned on and transistor M4 is turned off. Thus, with transistors M3 and M6 turned on, the voltage on bit line 512 is equal to the bias voltage VLB plus the voltage drops associated with transistors M3 and M6.

Figure 6:
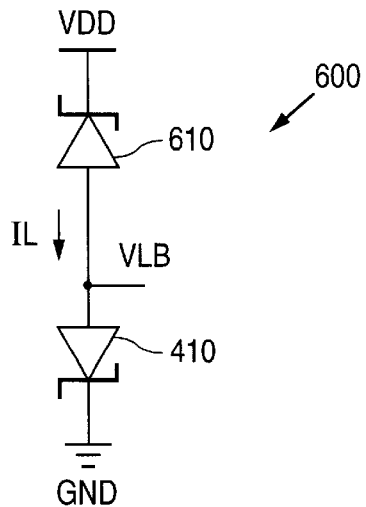
FIG. 6 is a schematic diagram illustrating a bias circuit 600 in accordance with the present invention.

FIG. 6 shows a schematic diagram that illustrates a bias circuit 600 in accordance with the present invention. Bias circuit 600 is similar to bias circuit 400 and, as a result, utilizes the same reference numerals to designate the structures which are common to both circuits.

As shown in FIG. 6, bias circuit 600 differs from bias circuit 400 in that the current generator GEN in circuit 400 is implemented in circuit 600 with a Schottky diode 610 which has an input connected to a power node and an output connected to the input of Schottky diode 410. In operation, Schottky diode 610 is formed so that diode 610 has a reverse-bias leakage current IL that functions as the reference current IREF.

Figure 7:
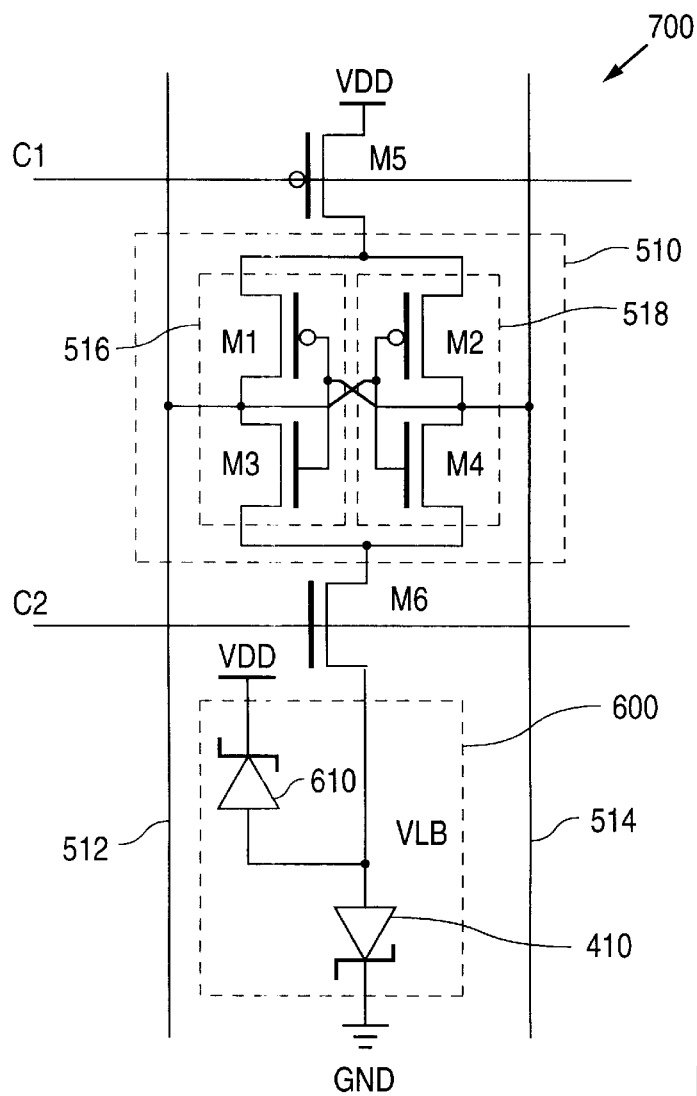
FIG. 7 is a schematic diagram illustrating a sense amplifier 700 in accordance with the present invention.

FIG. 7 shows a schematic diagram that illustrates a sense amplifier 700 in accordance with the present invention. Sense amplifier 700 is similar to sense amplifier 500 and, as a result, utilizes the same reference numerals to designate the structures which are common to both amplifiers.

As shown in FIG. 7, sense amplifier 700 differs from sense amplifier 500 in that amplifier 700 utilizes bias circuit 600 rather than bias circuit 400. Sense amplifier 700 operates the same as sense amplifier 500.

Figure 8:
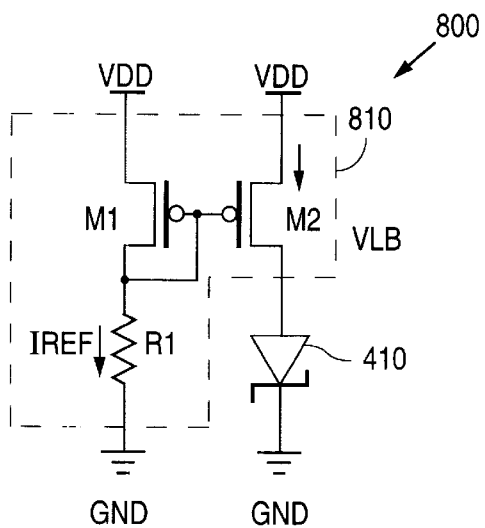
FIG. 8 is a schematic diagram illustrating a bias circuit 800 in accordance with the present invention.

FIG. 8 shows a schematic diagram that illustrates a bias circuit 800 in accordance with the present invention. Bias circuit 800 is similar to bias circuit 400 and, as a result, utilizes the same reference numerals to designate the structures which are common to both circuits.

As shown in FIG. 8, bias circuit 800 differs from bias circuit 400 in that the current generator GEN in circuit 400 is implemented in circuit 800 with a current mirror 810. As further shown in FIG. 8, current mirror 810 includes a first transistor M1 which has a source connected to a power supply node, a drain, and a gate connected to the drain.

In addition, current mirror 810 also includes a resistor R1 which is connected to the drain of transistor M1 and ground, and a second transistor M2 which has a source connected to the power supply node, a drain connected to the input of Schottky diode 410, and a gate connected to the gate of the first transistor M1.

In operation, resistor R1 defines a reference current IREF which flows through diode-connected transistor M1 and resistor R1. The reference current IREF is mirrored by transistor M2, and is sufficient to bias Schottky diode 410 to set the low positive bias voltage VLB at the input of diode 410.

Figure 9:
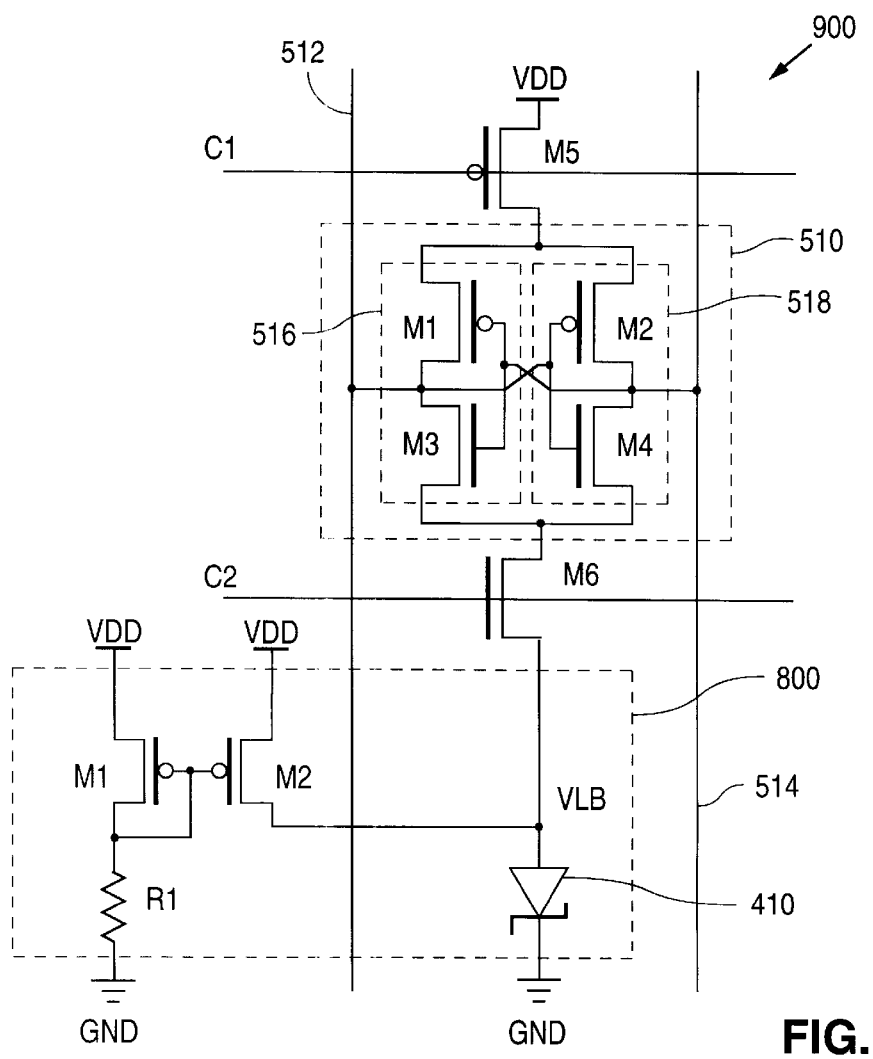
FIG. 9 is a schematic diagram illustrating a sense amplifier 900 in accordance with the present invention.

FIG. 9 shows a schematic diagram that illustrates a sense amplifier 900 in accordance with the present invention. Sense amplifier 900 is similar to sense amplifier 500 and, as a result, utilizes the same reference numerals to designate the structures which are common to both amplifiers.

As shown in FIG. 9, sense amplifier 900 differs from sense amplifier 500 in that amplifier 900 utilizes bias circuit 800 rather than bias circuit 400. Sense amplifier 900 operates the same as sense amplifier 500.

Figure 10:
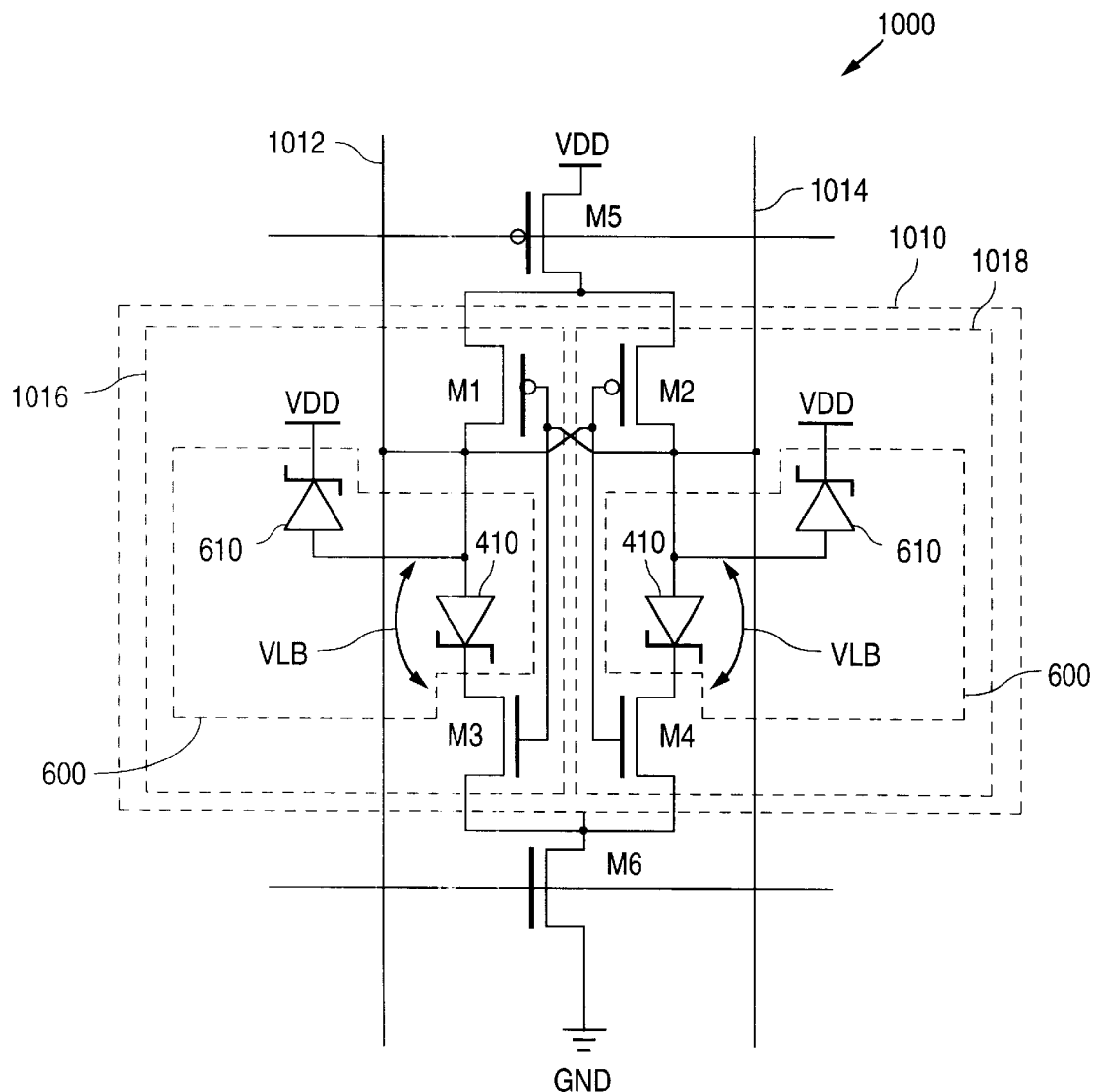
FIG. 10 is a schematic diagram illustrating a sense amplifier 1000 in accordance with the present invention.

FIG. 10 shows a schematic diagram that illustrates a sense amplifier 1000 in accordance with the present invention. As shown in FIG. 10, sense amplifier 1000 includes a detection circuit 1010 which is connected to a bit line 1012 and a memory line 1014, such as a bit line or a reference line.

Detection circuit 1010 includes a first inverter 1016 which has an output connected to bit line 1012 and an input connected to memory line 1014. Inverter 1016 is implemented with a p-channel transistor M1, bias circuit 600, and a n-channel transistor M3. Transistor M1 has a source, a drain connected to bit line 1012, and a gate connected to memory line 1014.

Bias circuit 600 has the inputs of Schottky diodes 410 and 610 connected to the drain of transistor M1, while transistor M3 has a source, a drain connected to the output of Schottky diode 410, and a gate connected to memory line 1014.

Detection circuit 1010 also includes a second inverter 1018 which has an output connected to memory line 1014 and an input connected to bit line 1012. Inverter 1018 is implemented with a p-channel transistor M2, bias circuit 600, and a n-channel transistor M4. Transistor M2 has a source connected to the source of transistor M1, a drain connected to memory line 1014, and a gate connected to bit line 1012.

Bias circuit 600 has the inputs of Schottky diodes 410 and 610 connected to the drain of transistor M2, while transistor M4 has a source connected to the source of transistor M3, a drain connected to the output of Schottky diode 410, and a gate connected to bit line 1012.

As further shown in FIG. 10, sense amplifier 1000 also includes a first switch which is implemented with a p-channel transistor M5, and a second switch which is implemented with a n-channel transistor M6. Transistor M5 has a source connected to a power node, a drain connected to the sources of transistors M1 and M2, and a gate connected to a first control line C1. Transistor M6 has a source connected to ground, a drain connected to the sources of transistors M3 and M4, and a gate connected to a second control line C2.

In operation, once a first logic state has been placed on bit line 1012 and a second logic state has been placed on memory line 1014, control line C1 is lowered to turn on transistor M5 while control line C2 is raised to turn on transistor M6.

The line 1012 or 1014 which has the logic high state turns on the n-channel transistor M3 or M4 which has a drain connected to the opposite line 1012 or 1014. As a result, the voltage on the opposite line 1012 or 1014 is equal to the bias voltage VLB plus the voltage drops associated with transistors M3 or M4, and M6.

For example, if a logic low is placed on bit line 1012 and a logic high is placed on memory line 1014, transistor M1 is turned off and transistor M3 is turned on. In addition, transistor M2 is turned on and transistor M4 is turned off. Thus, with transistors M3 and M6 turned on, the voltage on bit line 1012 is equal to the bias voltage VLB plus the voltage drops associated with transistors M3 and M6.

One of the advantages of the present invention is that Schottky diodes consume relatively little silicon real estate. As described in application Ser. No. 09/280,888 for SCHOTTKY DIODE WITH REDUCED SIZE filed on Mar. 29, 1999 by Alexander Kalnitsky et al., which is hereby incorporated by reference, Schottky diodes can be formed through field oxide regions in a manner which requires little if any additional silicon real estate.

Figure 12A:
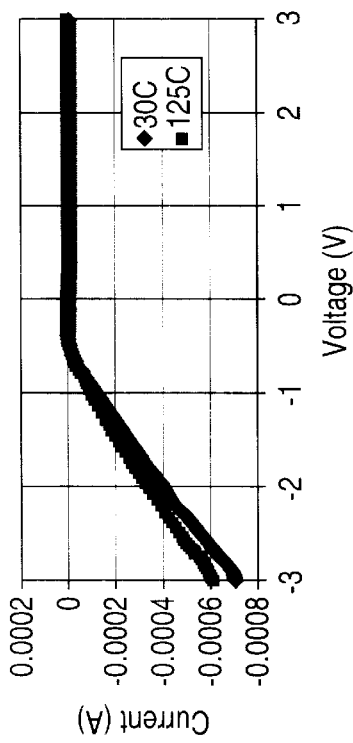
FIGS. 12A–12B are a pair of graphs illustrating the I/V relationship of a Schottky diode which has titanium silicide ($TiSi_2$) formed over a lightly-doped p-type region.
Figure 11A:
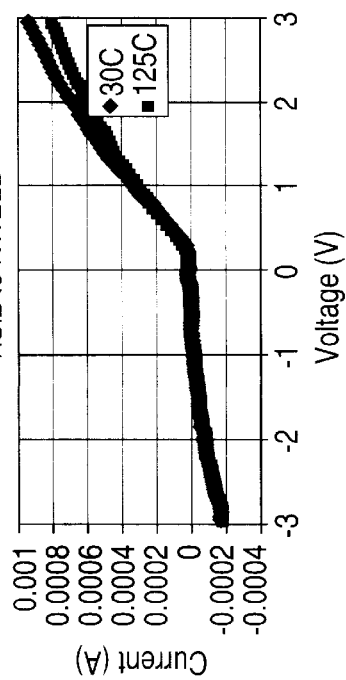
FIGS. 11A–11B are a pair of graphs illustrating the I/V relationship of a Schottky diode which has titanium silicide ($TiSi_2$) formed over a lightly-doped n-type region.
Figure 12B:
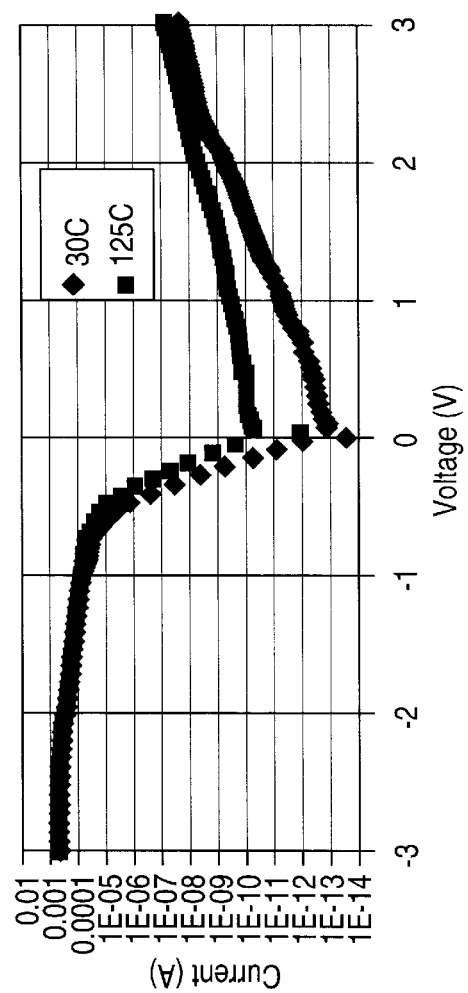
Figure 11B:
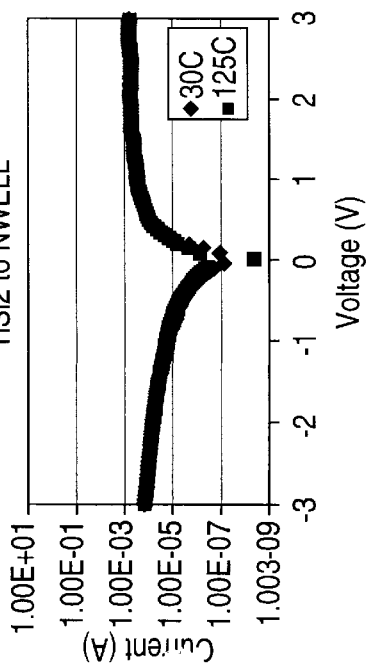

FIGS. 11A–11B show a pair of graphs that illustrate the I/V relationship of a Schottky diode which has titanium silicide ($TiSi_2$) formed over a lightly-doped n-type region, while FIGS. 12A–12B show a pair of graphs that illustrate the I/V relationship of a Schottky diode which has titanium silicide ($TiSi_2$) formed over a lightly-doped p-type region.

Figure 13A:
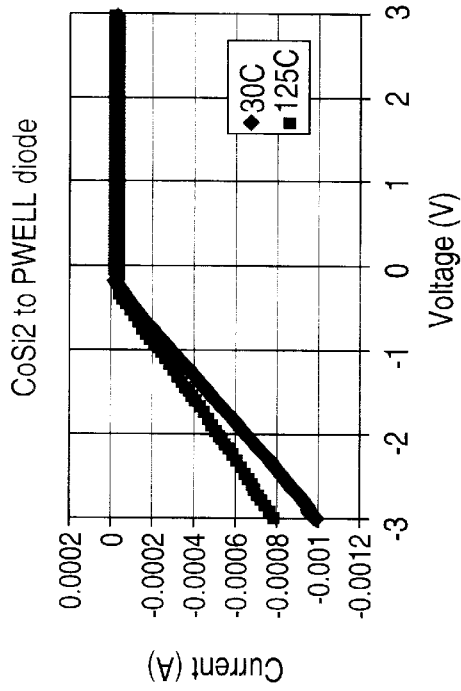
FIGS. 13A–13B are a pair of graphs illustrating the I/V relationship of a Schottky diode which has cobalt silicide ($CoSi_2$) formed over a lightly-doped n-type region.
Figure 13B:
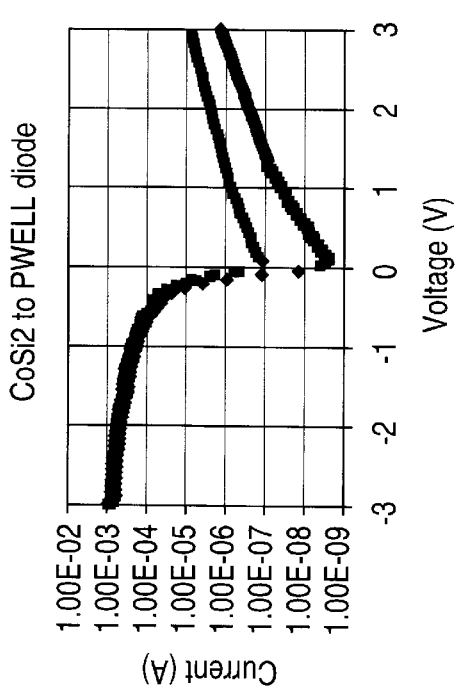
Figure 14A:
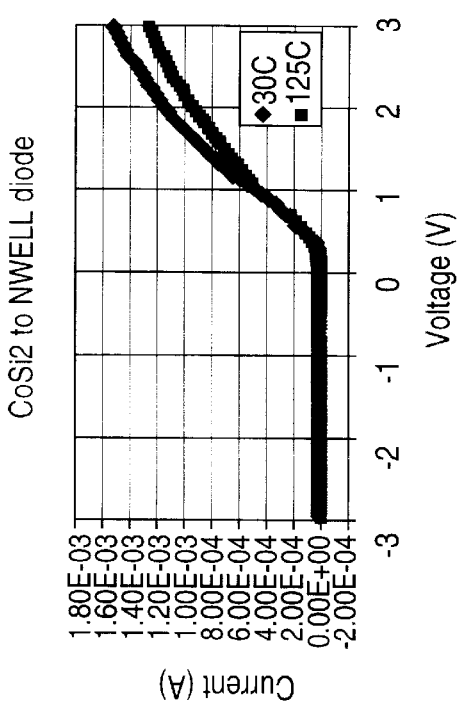
FIGS. 14A–14B are a pair of graphs illustrating the I/V relationship of a Schottky diode which has cobalt silicide ($CoSi_2$) formed over a lightly-doped p-type region.
Figure 14B:
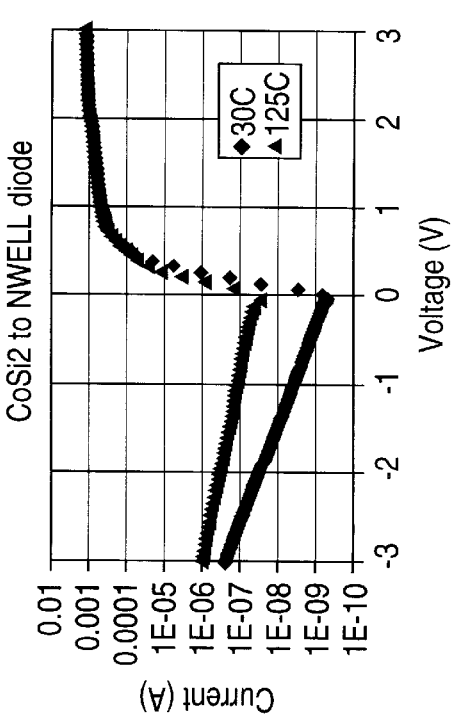

FIGS. 13A–13B show a pair of graphs that illustrate the I/V relationship of a Schottky diode which has cobalt silicide ($CoSi_2$) formed over a lightly-doped n-type region, while FIGS. 14A–14B show a pair of graphs that illustrate the I/V relationship of a Schottky diode which has cobalt silicide ($CoSi_2$) formed over a lightly-doped p-type region.

As shown in FIGS. 11A–11B, 12A–12B, 13A–13B, and 14A–14B, another advantage of the present invention is that bias circuits 400, 600, and 800 require only a small current to bias Schottky diode 410 to drop approximately 0.1 to 0.3 volts. As a result, power consumption by the bias circuits is very low.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A sense amplifier comprising:
   a first transistor having a source, a drain connected to a bit line, and a gate connected to a memory line;
   a first bias circuit connected to the drain of the first transistor, the first bias circuit having:
      a first current source circuit connected to the drain, the first current source circuit sourcing a first reference current; and
      a first Schottky diode having an input connected to the drain, and an output;
   a second transistor having a source, a drain connected to the output of the first Schottky diode, and a gate connected to the memory line;
   a third transistor having a source, a drain connected to the memory line, and a gate connected to the bit line;
   a second bias circuit connected to the drain of the third transistor, the second bias circuit having:
      a second current source circuit connected to the drain of the third transistor, the second current source circuit sourcing a second reference current; and
      a second Schottky diode having an input connected to the drain of the third transistor, and an output;

a fourth transistor having a source, a drain connected to the output of the second Schottky diode, and a gate connected to the bit line;

a first switch connected to the sources of the first and third transistors; and a second switch connected to the sources of the second and fourth transistors.

2. The sense amplifier of claim 1 wherein the first current source circuit includes a third Schottky diode having an input connected to the drain of the first transistor, and a reverse-bias leakage current that forms the first reference current.

3. The sense amplifier of claim 2 wherein the second current source circuit includes a fourth Schottky diode having an input connected to the drain of the third transistor, and a reverse-bias leakage current that forms the second reference current.

* * * * *